United States Patent
Altintas et al.

(10) Patent No.: US 7,779,338 B2
(45) Date of Patent: Aug. 17, 2010

(54) DEINTERLEAVER AND DUAL-VITERBI DECODER ARCHITECTURE

(75) Inventors: Mustafa Altintas, Irvine, CA (US);
Turgut Aytur, Plattsburgh, NY (US);
Ravishankar H. Mahadevappa, Irvine, CA (US); Feng Shi, Irvine, CA (US);
Stephan ten Brink, Irvine, CA (US);
Ran Yan, Holmdel, NJ (US)

(73) Assignee: Realtek Semiconductor Corp., Hsinchu (TW)

( * ) Notice: Subject to any disclaimer, the term of this patent is extended or adjusted under 35 U.S.C. 154(b) by 963 days.

(21) Appl. No.: 11/490,844

(22) Filed: Jul. 21, 2006

(65) Prior Publication Data
US 2007/0067704 A1    Mar. 22, 2007

Related U.S. Application Data

(60) Provisional application No. 60/701,680, filed on Jul. 21, 2005.

(51) Int. Cl.
*H03M 13/03* (2006.01)
(52) U.S. Cl. ...................................................... 714/795
(58) Field of Classification Search .......... 714/795–796
See application file for complete search history.

(56) References Cited

U.S. PATENT DOCUMENTS

| | | | |
|---|---|---|---|
| 5,042,036 A | 8/1991 | Fettweis | |
| 6,038,695 A * | 3/2000 | Pehkonen | 714/786 |
| 6,201,838 B1 | 3/2001 | Kim | |
| 6,333,922 B1 | 12/2001 | Campanella | |
| 6,343,105 B1 | 1/2002 | Saegusa | |
| 6,381,728 B1 * | 4/2002 | Kang | 714/781 |
| 6,434,203 B1 * | 8/2002 | Halter | 375/341 |
| 7,065,696 B1 * | 6/2006 | Liu et al. | 714/755 |
| 7,131,055 B2 | 10/2006 | Mathew et al. | |
| 7,519,872 B2 * | 4/2009 | Lee | 714/701 |
| 2002/0116682 A1 | 8/2002 | Brick | |
| 2007/0205921 A1 * | 9/2007 | Sawitzki | 341/50 |

OTHER PUBLICATIONS

De Castro et al., 8-VSB Channel coding analysis for DTV broadcast, Jun. 2000, IEEE, p. 539-547.*
Kang et al., Low power Viterbi decoder for for CDMA mobile terminals, Mar. 1998, IEEE Journal of Solid State Circuits vol. 33, No. 3., p. 473-482.*

(Continued)

*Primary Examiner*—Shelly A Chase
(74) *Attorney, Agent, or Firm*—Thomas, Kayden, Horstemeyer & Risley, LLP

(57) ABSTRACT

Pairs of parallel Viterbi decoders use windowed block data for decoding data at rates above 320 Mbps. Memory banks of the deinterleavers feeding the decoders operate such that some are receiving data while others are sending data to the decoders. Parallel input streams to every pair of decoders overlap for several traceback lengths of the decoder causing data input to a first decoder at the end of an input stream to be the same as the data input to a second decoder of the same pair at the beginning of an input stream. Then, the first decoder is able to post-synchronize its path metric with the second decoder and the second decoder is able to pre-synchronize its path metric with the first. Either, the deinterleaver data length is an integer multiple of the traceback length or the data input to only the first block of the first interleaver is padded.

11 Claims, 9 Drawing Sheets

OTHER PUBLICATIONS

Wyk et al., Application of burst error correction Viterbi algorithm to Q2PSK on Rician fading channels, 1996, IEEE, p. 576-586.*

International Search Report for International Patent Application No. PCT/US2006/028394, filed Jul. 21, 2006, International Search Report dated Apr. 12, 2007 and mailed Oct. 31, 2007 (2 pgs.).

Written Opinion of the International Searching Authority for International Patent Application No. PCT/US2006/028394, filed Jul. 21, 2006, Written Opinion dated Apr. 12, 2007 and mailed Oct. 31, 2007 (4 pgs.).

* cited by examiner

DEINTERLEAVER AND DUAL-VITERBI DECODER ARCHITECTURE

CROSS-REFERENCE TO RELATED APPLICATION(S)

This application claims the benefit of the filing date of U.S. Provisional Patent Application No. 60/701,680, filed Jul. 21, 2005, the disclosure of which is incorporated by reference herein.

BACKGROUND OF THE INVENTION

The present invention relates generally to wireless communication systems, and more particularly to a deinterleaving and decoding method and system useful with ultrawideband orthogonal frequency division multiplexing (UWB-OFDM) communication systems.

Wireless communication systems, generally radio frequency (RF) communication systems, often communicate using signals about a specific predetermined carrier frequency. Signals at specific frequencies may be particularly subject to disruption due to interference caused by multipath effects, other transmitters or other factors. Signals at specific frequencies may also dominate use of bandwidth about the specific frequencies, leaving less of the frequency spectrum available for use by others. Also, signals at specific frequencies may provide insufficient bandwidth for particular communications.

Ultrawideband (UWB) communication systems generally communicate using signals over a wide band of frequencies. Use of a wide band of frequencies may allow for increased effective bandwidth between devices and may minimize effects of interference about any particular frequency.

Orthogonal frequency division multiplexing (OFDM) methods used by communication systems transmit information over a number of communication channels about different frequencies. Each channel includes information transmitted over a number of sub-bands, each at slightly different frequencies.

UWB-OFDM communication systems, however, may require significant processing of transmitted and received information. Processing tools such as encoders, interleavers, and decoders are not designed for rapid processing of high rates of data. As a result, data processing in UWB-OFDM communication systems may become time consuming.

SUMMARY OF THE INVENTION

In one aspect, the invention comprises a deinterleaver and decoder system comprising a deinterleaver for deinterleaving data, the deinterleaver including a plurality of memory banks for storing deinterleaved data and a plurality of Viterbi decoders for decoding the deinterleaved data, the Viterbi decoders each configured to access separate memory banks at separate times. Wherein a number of decoding steps undertaken by the Viterbi decoder for decoding the deinterleaved data is equal to the deinterleaver data length in bits.

In another aspect, the invention comprises a data decoding system comprising a deinterleaver for deinterleaving demodulated data and a pair of Viterbi decoders configured to operate in parallel for decoding deinterleaved data. The pair of Viterbi decoders includes a first Viterbi decoder and a second Viterbi decoder.

These and other aspects of the invention are more fully comprehended on review of this disclosure, including the figures which are part thereof.

DETAILED DESCRIPTION OF THE INVENTION

Figure 1:
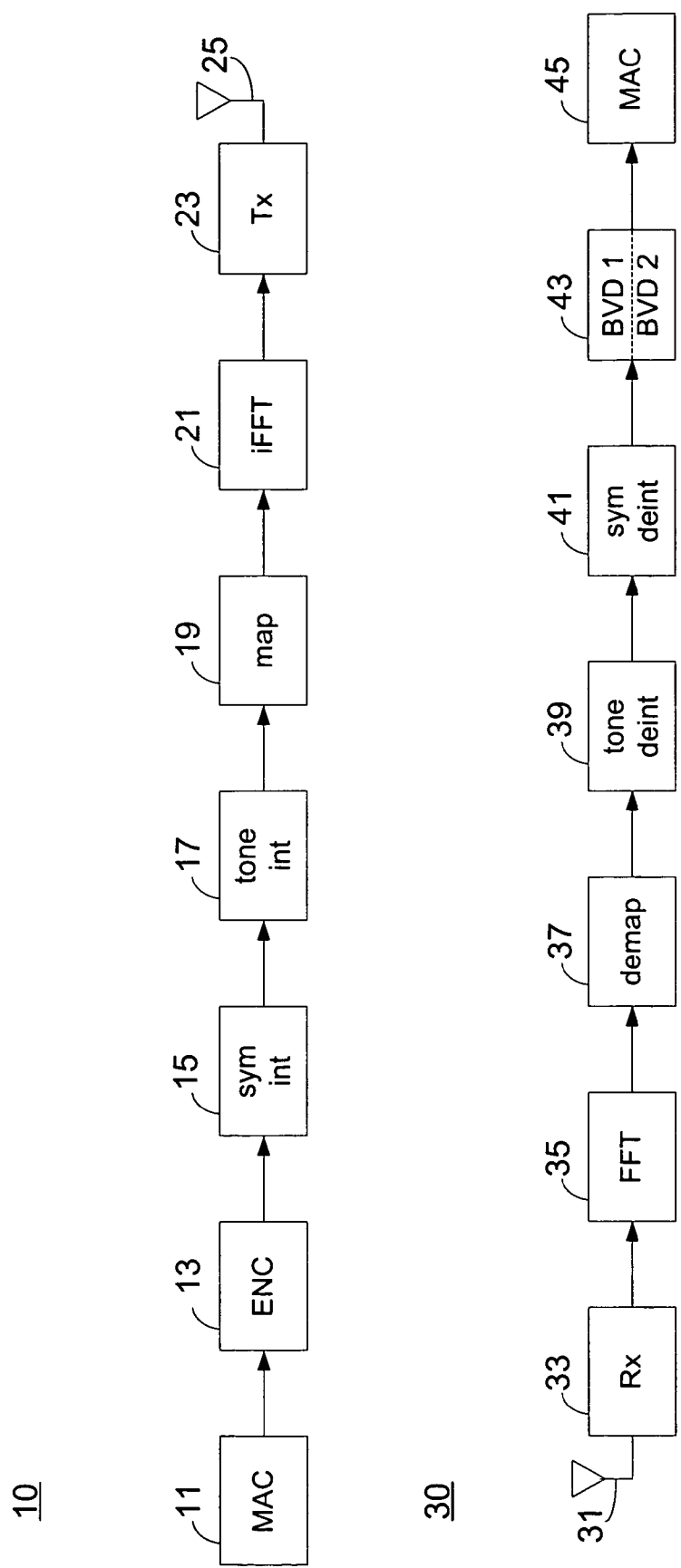
FIG. 1 is a block diagram of a communication system including transmission and reception systems in accordance with aspects of the invention.

FIG. 1 is a block diagram of a transmitter 10 and a receiver 30 in accordance with aspects of the invention. The transmitter 10 includes a media access control (MAC) 11 coupled to an encoder 13, a symbol interleaver 15, a tone interleaver 17, a mappers 19, an iFFT block 21, and an analog RF block 23, all in series. The analog RF block 23 transmits the data over a transmitter antenna 25. A stream of data is provided by the MAC 11. The MAC 11 may provide data in the form of bytes or words. The encoder 13 operates on the data. The symbol interleaver 15 receives the data from the encoder 13 and interleaves the received data. The tone interleaver 17 receives the data stream from the symbol interleaver 15. The mapper 19 receives the tone interleaved data and maps or modulates the interleaved data according to a mapping scheme. The mapper may map data using various modulation schemes such as a quadrature phase shift key (QPSK) modulation scheme, a dual carrier modulation (DCM) scheme, or a 16QAM constellation, with the selected scheme depending on an information rate selected by the MAC 11.

For higher data rates, when data is received from the MAC over a two byte interface, a high byte is encoded by a first encoder and the low byte is encoded by a second encoder. One symbol interleaver, and dual tone interleavers, would be associated with each encoder. Two mappers each separately map the interleaved encoded bits associated with the two encoders.

The inverse fast Fourier Transform (iFFT) block 21 receives the symbols from the mapper 19 and transforms the symbols from the frequency domain back to the time domain. The analog RF block 23 receives the time domain symbols from the iFFT block 21 for transmission via one or more antennas 25.

When transmission is performed with multiple antennas, such as two antennas, the antennas may operate in a cross-polarized configuration each possibly with associated up-conversion circuitry. Therefore, if a second transmitter antenna is driven by the same digital baseband signal, the two transmitter antennas may radiate in two spatial polarizations. The input signal to the analog RF of the transmitter may be modified in phase and amplitude (in digital baseband) by a constant complex multiplier for fine-tuning with regard to a particular antenna or installation geometry.

The receiver 30 of FIG. 1 may receive signals using a single antenna 31 or multiple receive antennas. The receiver 30 further includes a receiver analog RF block 33 associated with the receive antennas. The receiver analog RF block may include signal reception circuitry and a signal processor which receive the signal from the antenna 31. The signal processor for the antenna performs, for example, packet detection, frame synchronization, and, in various embodiments, processing associated with control of automatic gain control features of the receiver. The signal processor provides one or more parallel data streams, which are transformed from the time domain to the frequency domain by a fast Fourier Transform (FFT) block 35.

A MRC block (not shown) may be located after the FFT block and before a demapper 37. When the outputs of the FFT blocks include even and odd symbols, outputs of FFT blocks providing even symbols are received by a first MRC block and outputs of FFT blocks providing odd symbols are received by a second MRC block. When more than one antenna is used, each MRC block receives some of its input from one of the antennas and the rest from the other antennas. When MRC blocks are used, the outputs of each MRC block is received by a demapper. The inputs from the FFT blocks to the MRC blocks are arranged such that the output of each pair of FFT blocks, coupled to the same analog RF block, is received by a separate corresponding demapper through the MRC blocks.

A demapper 37 may be coupled to the FFT block 35 and receives the frequency domain transforms of the received data stream that are provided by the FFT block. The demapper 37 demaps the data, for example in accordance with a 16-QAM deinterleavers constellation. One or more tone deinterleavers 39 receive the demapped data from the demapper 37. The tone deinterleaver is coupled to a symbol deinterleaver 41. In various embodiments where more than one demapper is used, a portion of each demapper output may be received by a separate tone deinterleaver associated with a symbol deinterleaver and another portion of each demapper output may be received by a different tone deinterleaver that is associated with a different symbol deinterleaver.

When more than one symbol deinterleaver 41 is used, each may be associated with a decoder, with possibly each symbol deinterleaver associated with a separate corresponding decoder. In FIG. 1, the symbol deinterleaver 41 may be associated with a Viterbi decoder or with a pair of Viterbi decoders 43. The output of each Viterbi decoder 43 is provided to a MAC 45. Different modulation (mapping) may be implemented by the mappers/demappers and different code rates may be implemented by the encoders/decoders, for example, based on a selected information rate.

Figure 2:
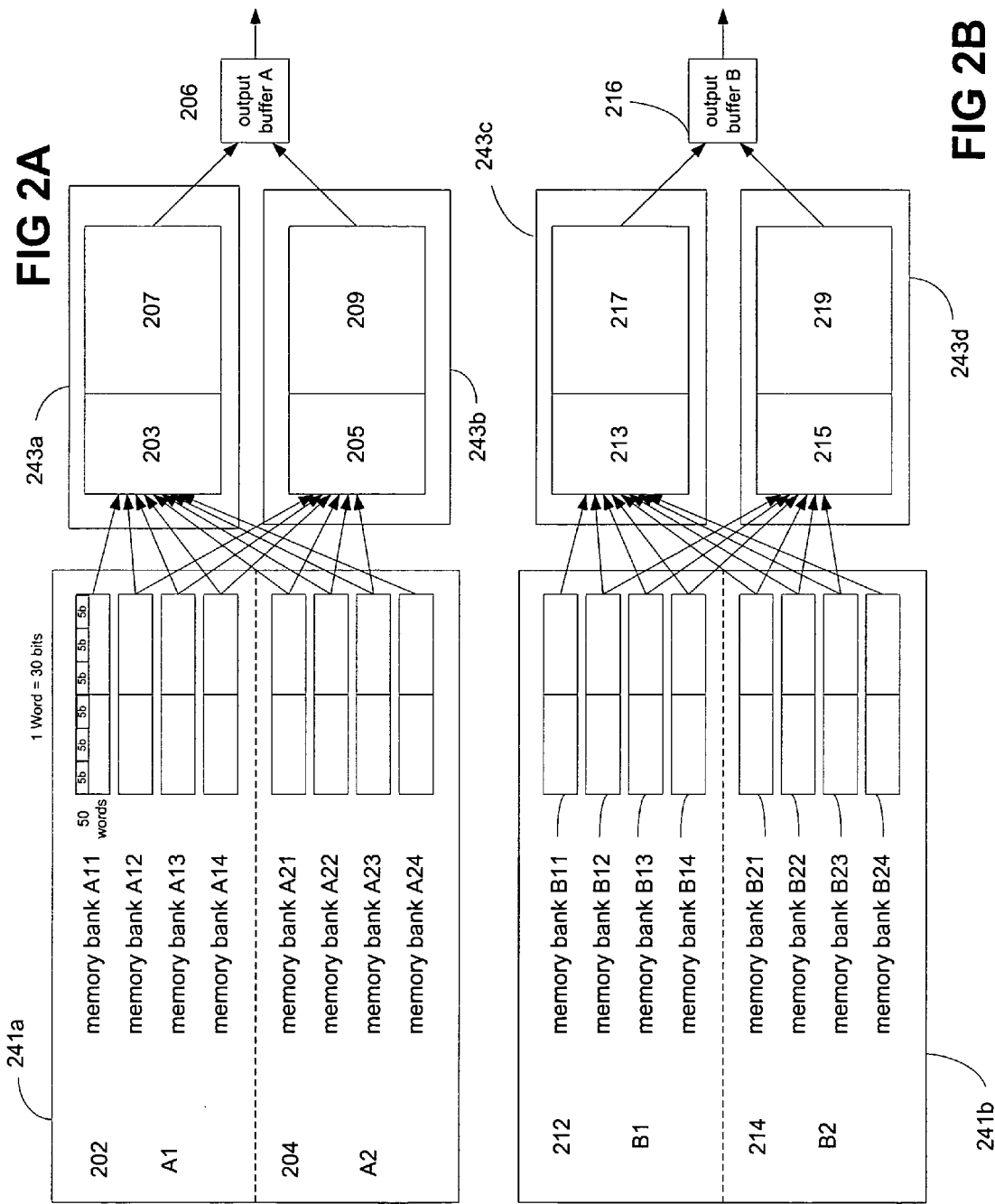
FIGS. 2A and 2B show an embodiment of a symbol deinterleaver structure, acting as an input buffer to Viterbi decoders of a reception system in accordance with aspects of the invention.

FIGS. 2A and 2B show an embodiment of an exemplary structure, where symbol deinterleavers 241a, 241b serve as input buffers for Viterbi decoders 243a, 243b in accordance with aspects of the invention.

In some embodiments, data from a deinterleaver is provided to multiple memory banks, for example in a round-robin fashion. The data may be read from the memory banks by multiple Viterbi decoders. Preferably, at high data rates, each Viterbi decoder decodes data from only some of the memory banks, while other Viterbi decoders decode data from other of the memory banks. However, each Viterbi decoder may receive data that is common to some of the banks, allowing the Viterbi decoders to pre-synchronize and post-synchronize.

In some embodiments, the deinterleaver may include a buffer for storing the deinterleaved data. Alternatively, the deinterleaver may provide the deinterleaved data to a storage buffer. The buffer for storing the deinterleaved data, whether within or outside a deinterleaver, includes multiple memory banks that are filled with data from a previous stage. The data are provided to the memory banks in an ordered fashion. For example, the data may fill the multiple memory banks of a deinterleaver in a round-robin fashion. The Viterbi decoders receive their data from the memory banks also in an ordered fashion. The ordered fashion of writing the data to the memory banks and reading the data from the memory banks prevents memory access conflicts. Memory access conflicts are avoided both in receiving the data at the memory banks from a previous processing stage and in sending the data to the Viterbi decoders.

The memory banks are divided into groups and when receiving data from a previous stage and sending data to the decoders, the groups of memory banks operate in a ping pong fashion. While one group is being filled with data, another group may be providing its stored data to the decoders. The groups, then, switch roles. The ping pong fashion of receiving and sending data avoids conflicts between reading the data from a memory bank and writing data to it.

The data may be read from the memory banks by multiple Viterbi decoders. Particularly at higher data rates, multiple Viterbi decoders may be operating on the data in parallel. In that situation, each Viterbi decoder decodes data from only some of the memory banks while other Viterbi decoders are decoding data from other of the memory banks. However, in a Viterbi decoding operation, a particular output of the decoder is generally dependent on multiple inputs to the decoder. Therefore, in order to allow the Viterbi decoders to pre-synchronize and post-synchronize their decoding operation, some data prior to the data being decoded and some data after the data being decoded are provided to each decoder. In other words, some of the data that are provided to one decoder for actual decoding may also be provided to another decoder to ramp up or wind down this decoder's operation.

The portion of data received by a particular Viterbi decoder to allow pre- and post-synchronization operations may be used by a different Viterbi decoder for decoding. This portion of the data is therefore subject to overlapping use by, for example, two decoders. However, the order of providing this data for its overlapping uses is such that no memory conflicts result from this operation.

In some embodiments, structure of the memory banks is dependent on aspects of operation of the Viterbi decoders and aspects relating to various sizes of the data words that may be received or processed by a receiver.

The Viterbi decoders implement the Viterbi algorithm. The Viterbi algorithm is a method of decoding convolutionally coded data. Convolutional codes are usually described using two parameters: the code rate, R=k/n, and the constraint length L. For the most commonly used convolutional codes, the inputs and outputs are defined in binary digits (bits), although more generally the inputs and outputs are symbols, which may be one or more bits. The code rate, k/n, is expressed as a ratio of the number of bits into the convolutional encoder (k) to the number of channel symbols output by the convolutional encoder (n) in a given encoder cycle. For example, in a rate 1/2 convolutional encoder, data bits are provided at a rate of k=1 bit per second and channel symbols are output at a rate of n=2 symbols per second.

The constraint length parameter, L, denotes the "length" of the convolutional encoder or the number of k-bit stages feeding the logic that produces the output symbols. The constraint length L also generally determines the number of stages used for the paths initiating from various states to converge into a single path. The computational requirements of Viterbi decoding generally grow exponentially as a function of the constraint length L.

Another parameter of the convolutional encoder is the quantization precision, m, at the receiver. The quantization precision, m, also indicates for how many encoder cycles an input bit is retained and used for encoding after it first appears at the input to the convolutional encoder. For example, if m=3, then a particular input bit is used for encoding 3 output symbols. Therefore, m also indicates the memory length of the encoder.

The Viterbi decoder operates by computing a metric or distance to signify the difference between the received or observed symbols and all of the possible channel symbols that could have been output by the encoder. Each recursion of the Viterbi decoding algorithm corresponds to an increment of one time step. At each recursion or at each stage, there are three major steps in the Viterbi decoding: 1) branch metric generation, 2) survivor path update for all states, and 3) most likely path traceback. During branch metric generation, the branch metrics or distances or costs for all possible transitions between all pairs of states in the given period of time are generated. During survivor path update for all states, for all of the incoming transitions to each state, the branch metric is added to the previous path metric. The path with the minimum sum is the updated survivor path for that state for the recursion. During most likely path traceback, the survivor path of a given state is traced back in order to determine the most likely path taken by the encoder and thus the most likely symbols in the sequence of input symbols transmitted.

For implementation, a Viterbi decoder may be partitioned into an add-compare-select unit (ACS), and a traceback unit (TB).

The ACS operation adds the previous path metric to all calculated branch metrics, compares the results and computes the new and updated path metric. For a convolutional code of rate R=k/n, the ACS unit of the corresponding Viterbi decoder comprises $M=2^k$ (two to the power of k) add-compare-select operations per information bit, generating M traceback bits which are stored in the traceback memory. The traceback bits flag which of the incoming hypotheses did win, i.e., store a history of surviving paths, to generate the decoded output by tracing back along surviving paths. In a fully parallel implementation, all M of the ACS operations for all the incoming data are operated in one clock cycle. Thus, as an example, for an ACS clock frequency of 330 MHz, the maximal throughput is limited to at most 330 Mbps for a radix 2 implementation. For example, with a code rate of 1/2 the ACS unit performs $2^1=2$ ACS operations per information bit which results in 2×320=640 million ACS operations for a data rate of 320 Mbps. If the clock frequency of the ACS operation is 330 MHz, then only 330 Million of the 640 Million ACS operations may be performed by one Viterbi decoder in one second.

The TB unit, including TB memory and control, stores the M traceback bits per ACS operation. The TB memory is organized in several memory banks of length T for storing T decoded information bits. Entries that are each M bits long occupy the memory banks of length T. T is the traceback length of the TB unit. The constraint length L of a Viterbi decoder is equal to the memory bank length T (L=T). Periodically, after every T of the ACS operations, a traceback is initiated, to output T decoded bits to the Viterbi decoder output buffer. The traceback is organized by first performing 2T steps for tracing back from the current decoding position of the ACS unit to synchronize into a final survivor path. Then T steps are performed outputting T decoded bits, or information bits, to the Viterbi output buffer. So, when two traceback length's worth of data is stored in the decoder, the decoder begins the traceback operation. No decoded data is output. The more recent length of traceback T is used for finding the final state of the data occurring before the more recent traceback length. Then the decoder traces back, decodes, and outputs the data from the period occurring before the more recent traceback length.

In one embodiment of the present invention, the traceback length of T=30 information bits was selected, to match with the deinterleaver lengths and code rates as defined in the standard document Multiband OFDM Physical Layer Specification, Release 1.0, Jan. 14, 2005, incorporated herein by reference. As explained above, the deinterleaver lengths in terms of code length and information length corresponding to each code rate are listed in Table 1. The deinterleaver lengths of 300, 600, and 1200 coded bits, respectively result in deinterleaver lengths of 600, 750, 900, and 960 information bits for code rates 1/2, 5/8, 3/4, and 4/5. Note that all information lengths of 600, 750, 900, and 960 bits are integer multiples of T=30 bits. This relationship supports a simplified windowed two-block Viterbi decoder operation.

As shown in detail in FIGS. 2A and 2B, each exemplary symbol deinterleaver 241a, 241b includes a pair of half-deinterleavers 202, 204 and 212, 214. Each half-deinterleaver 202, 204, 212, 214 includes four memory banks. Each memory bank may include 50 words. Each word has 30 bits and can accommodate 6 soft outputs from the demapper when each demapper soft output includes 5 bits. In short, each memory bank may store 50 words that are each 30 bits long and each include 6 of the 5-bit soft outputs of a demapper. As shown in FIG. 2A, the first half-deinterleaver 202 includes the four memory banks A11, A12, A13, and A14. The remaining half-deinterleavers 204, 212, 214 are similarly structured to respectively include the four memory banks A21, A22, A23, A24, the four memory banks B11, B12, B13, B14, and the four memory banks B21, B22, B23, B24.

The four memory banks in each half-deinterleaver allow collision-free access by the block Viterbi decoders while concurrently decoding their particular part of the deinterleaver memory. Every two Viterbi decoders corresponding to one symbol deinterleaver operate concurrently and each decoder decodes its half of the symbol deinterleaver memory. For example, first and second Viterbi decoders 243a, 243b that correspond to a first symbol deinterleaver 241a, work concurrently to each decode half of the memory banks A11, A12, A13, A14, A21, A22, A23, A24 of the first symbol deinterleaver.

The half-deinterleavers 202, 204 are used in a ping-pong fashion with their corresponding Viterbi decoders 243a, 243b. While the Viterbi decoders are reading from the first half-deinterleaver 202, the second half-deinterleaver 204 is being filled with the soft output bits from demappers, for example, from first and second demappers 637a, 637b of FIG. 6. While the Viterbi decoders are reading from the second half-deinterleaver 204, the first half-deinterleaver 202 is being filled with the soft output bits from the demappers.

Each Viterbi decoder may be coupled to and preceded by a depuncturer. Alternatively, the Viterbi decoders may include a depuncturer 203, 205, 213, 214 and a decoder 207, 409, 217, 219. The first Viterbi decoder 243a in some embodiments, can access, through a first depuncturer 203, deinterleaver memory banks A11-A14 and A21-A24, while the second Viterbi decoder 243b can access memory banks A12-A14 and A21-A23.

Third and fourth Viterbi decoders 243c, 243d are similarly partitioned and access the first and second half-deinterleavers 212, 214 of a second symbol deinterleaver 241*b* in the same manner as the first and second Viterbi decoders.

Decoded data from each pair of the Viterbi decoders may be sent to an output buffer 206, 216.

Table 1 shows an embodiment of different rate groups with a corresponding data rate and code rate used for each group. Rate groups 1 and 2 and a portion of rate group 3, up to a data rate of 480 Mbps, are as defined in the Multiband OFDM Physical Layer Specification. Rate group 3, with data rate of 512 Mbps, and rate group 4 are extensions thereof.

Rate group 1 includes data rates of 53.3 and 80 Mbps. Rate group 2 includes data rates of 106.7, 160, and 200 Mbps. Rate group 3 includes data rates of 320, 400, 480, and 512 Mbps. Rate group 4 includes data rates of 640, 800, 960, and 1024 Mbps. For rate groups 1 and 2, the modulation/demodulation scheme employed by the mappers and the demappers is the QPSK scheme. For rate group 3, the modulation/demodulation scheme employed is the DCM scheme. For rate group 4, the modulation/demodulation scheme employed is the 16QAM scheme.

For rate groups 1 and 2, only one tone interleaver at the transmitter 10 and one Viterbi decoder at the receiver 30 are used. For rate group 3, a second tone interleaver at the transmitter and a second Viterbi decoder at the receiver are switched on in addition to those operating for the rate groups 1 and 2. For rate group 4, a second encoder together with its associated third and fourth tone interleavers are switched on at the transmitter. At the receiver, third and fourth Viterbi decoders are switched on in addition to those operating for the rate groups 1, 2, and 3. So, for rate group 4 at the receiver, a pair of demappers separate the incoming data streams into two streams resulting in four streams of data. The four data streams are divided into two pairs. One pair drives a first pair of tone deinterleavers, a first symbol deinterleaver, and a first pair of Viterbi decoders. The other pair of data streams drives a second pair of tone deinterleavers, a second symbol deinterleaver, and a second pair of Viterbi decoders.

Figure 3:
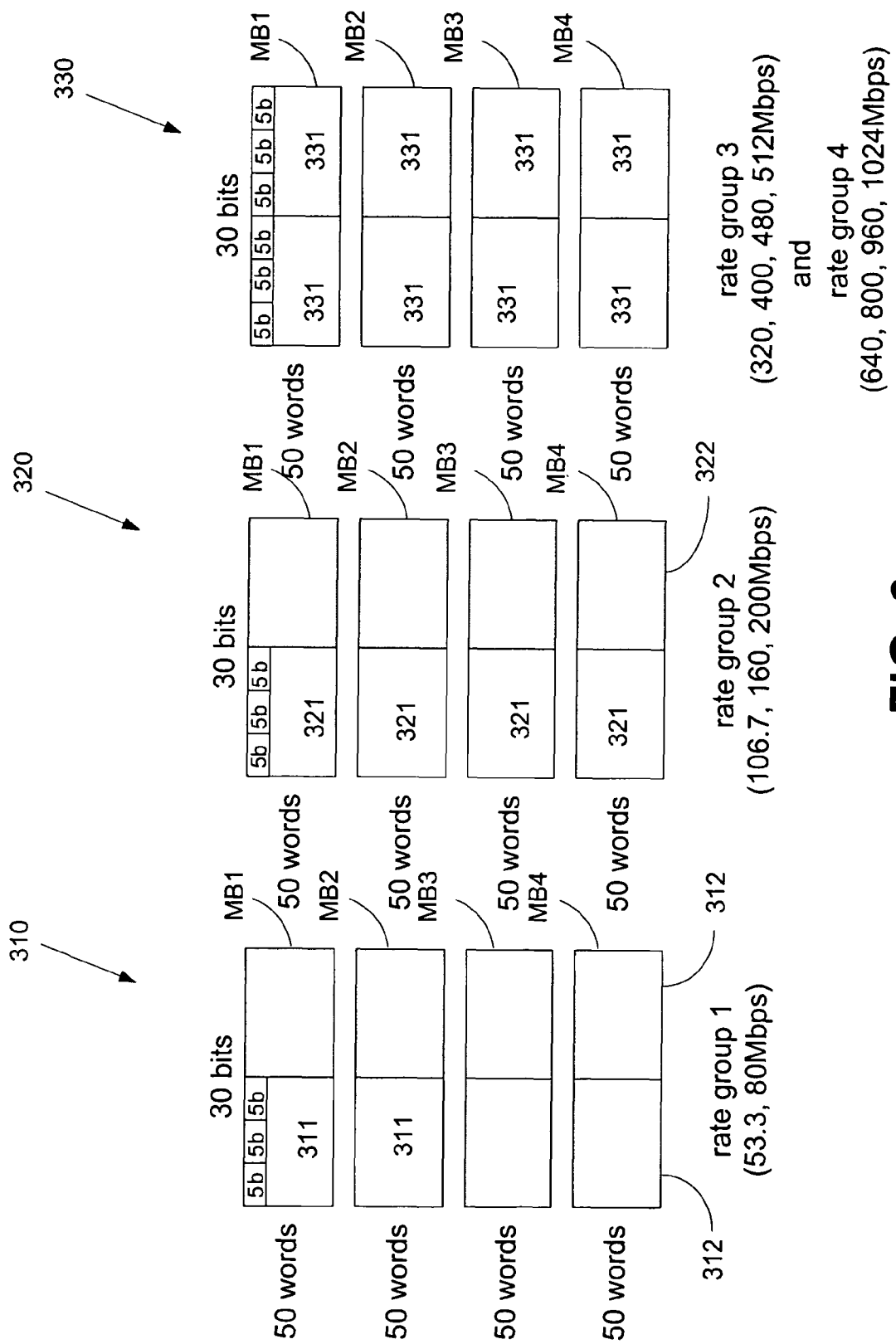
FIG. 3 illustrates usage of symbol deinterleaver memory for different data rate groups in accordance with aspects of the invention.

FIG. 3 further illustrates the use of the deinterleaver memory for the different rate groups shown in Table 1 in accordance with aspects of the invention.

Memory structure of a half-deinterleaver 310, 320, 330 similar to the half-deinterleavers 202, 204, 212, 214 of FIGS. 2A and 2B is shown in FIG. 3. The half-deinterleaver includes four memory banks MB1, MB2, MB3, MB4. Each of the four memory banks may contain 50 words that are each 30 bits long. Memory use maps 310, 320, 330 show memory use in one 30-bit word for each of the four memory banks of one half-deinterleaver, and for each rate group 1 and 2 and a combined rate group including rate groups 3 and 4.

Memory use map 310 corresponds to rate group 1 where only the first Viterbi decoder 243*a* is active. In-use areas 311 are shown without hashing and unused memory areas 312 are hashed. For rate group 1, as the memory use map 310 indicates, one quarter of the deinterleaver memory is being used.

Memory use map 320 corresponds to rate group 2 where still only the first Viterbi decoder 243*a* is active. In-use areas 321 are shown without hashing and unused memory areas 322 are hashed. For rate group 2, as the memory use map 320 indicates, one half of the deinterleaver memory is being used.

Memory use map 330 corresponds to rate groups 3 and 4 where either the first and second Viterbi decoders 243*a*, 243*b* or all four Viterbi decoders 243*a*, 243*b*, 243*c*, 243*d* are active. In-use areas 331 are shown without hashing. For rate groups 3 and 4, as the memory use map 330 indicates, the entire half-deinterleaver memory for each half-deinterleaver is being used.

FIGS. 2A and 2B shows how the half-deinterleavers are used in a ping-pong-fashion between their preceding demappers and their succeeding Viterbi decoders. Additionally, as explained below, in a fully parallel implementation of an ACS unit of the Viterbi decoder, with a clock frequency of 330 MHz, the maximum throughput from the half-deinterleavers to each Viterbi decoder is 330 Mbps for radix 2 data. For concurrent processing of data arriving at a rate higher than the ACS clock frequency of a Viterbi decoder, several Viterbi decoders may to be used in parallel.

For high data rates when two or more decoders are used in parallel, the decoders overlap their data processing and some parts of the data are processed by both. For example, to allow parallel decoding of different fragments of a received code word for rate groups 3 and 4, the first and second Viterbi decoders 243*a*, 243*b* perform overlapped processing and the third and fourth Viterbi decoders 243*c*, 243*d* perform another overlapped processing.

In parallel decoding that uses data overlapped processing, an end portion of the code words being decoded by a first Viterbi decoder are also input to a second and succeeding Viterbi decoder to pre-synchronize the second Viterbi decoder with the first. Also, a beginning portion of code words being decoded by the second Viterbi decoder continue to be decoded by the first in order to post-synchronize the first Viterbi decoder with the second.

The pre-synchronizing allows the second Viterbi decoder to ramp up its path metrics by using the path metrics calculated by the previous Viterbi decoder. The post-synchronizing allows the first Viterbi decoder to use a few path metrics calculated by the second Viterbi decoder to synchronize its traceback operation with the second Viterbi decoder.

FIGS. 4A, 4B, 4C, and 4D show exemplary embodiments of the deinterleaver memory access including pre- and post-synchronization between two Viterbi decoders being used in parallel for decoding data in accordance with aspects of the invention. FIGS. 4A-4D illustrate deinterleaver memory access for data rates of 320 Mbps, 400 Mbps, 480 Mbps, and 512 Mbps, respectively. Other data rates may be used by the methods and systems described.

Figure 4A:
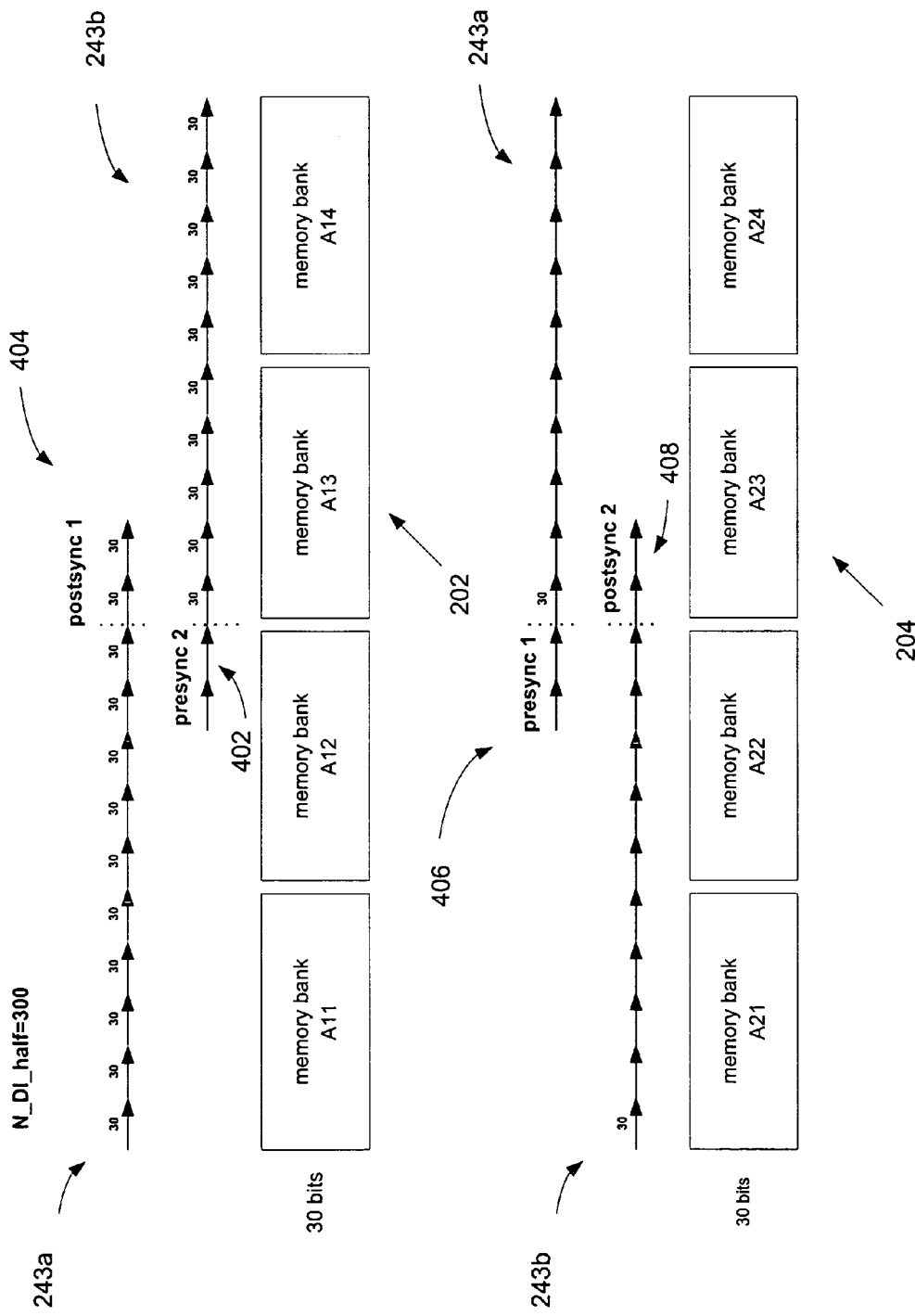
FIGS. 4A, 4B, 4C, and 4D show exemplary embodiments of the deinterleaver memory access including pre- and post-synchronization between two Viterbi decoders operating in parallel for decoding data in accordance with aspects of the invention.
Figure 4B:
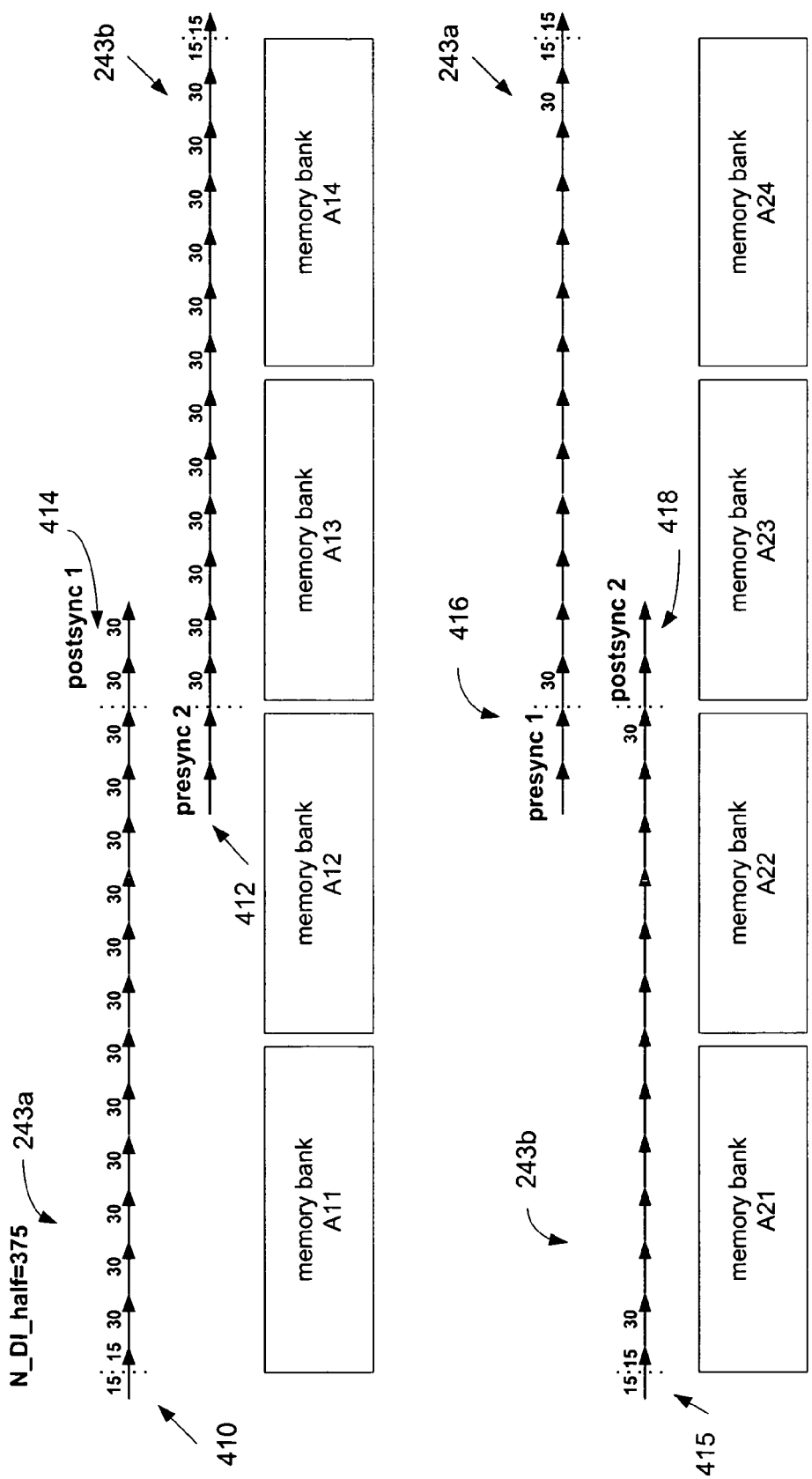
Figure 4C:
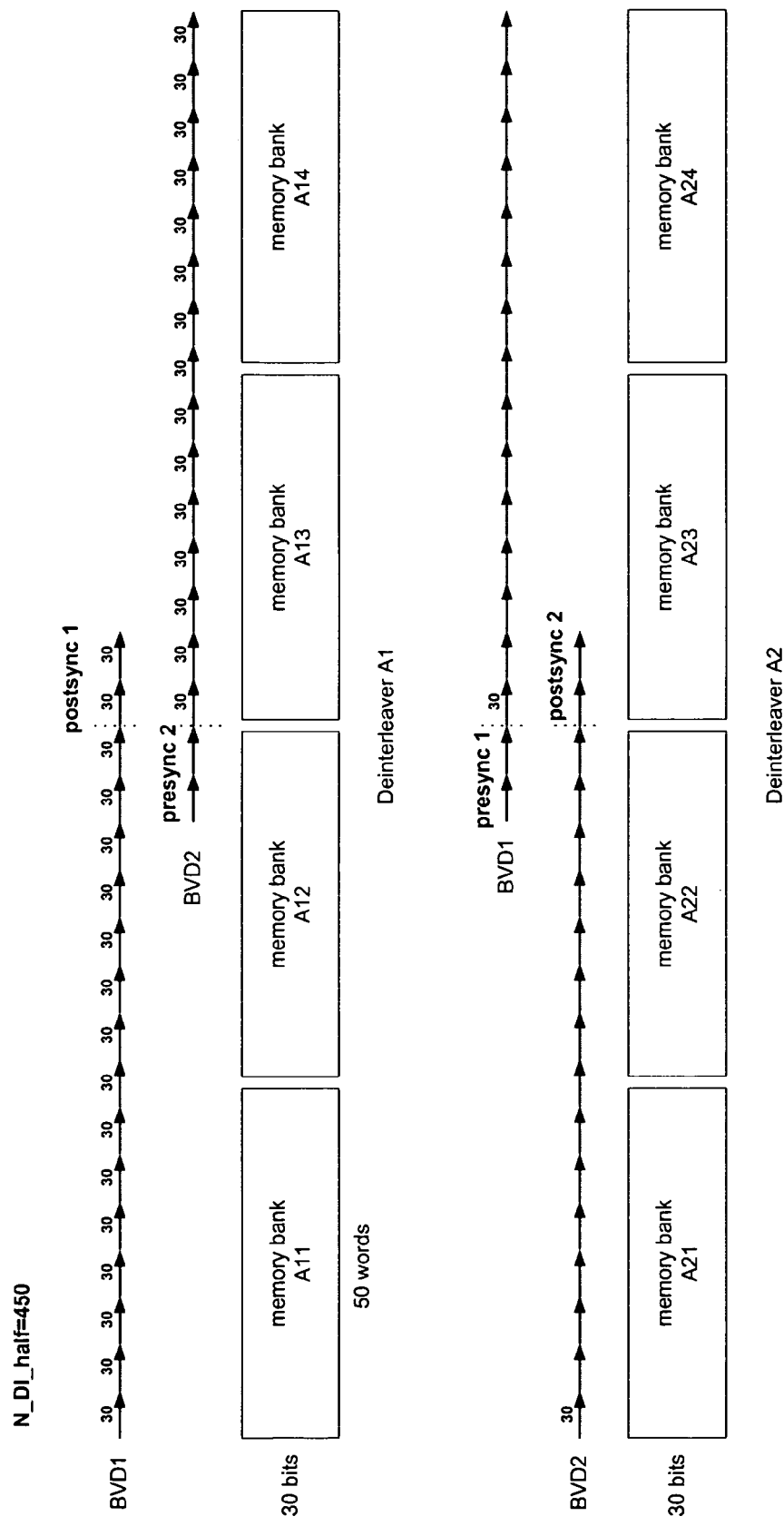
Figure 4D:
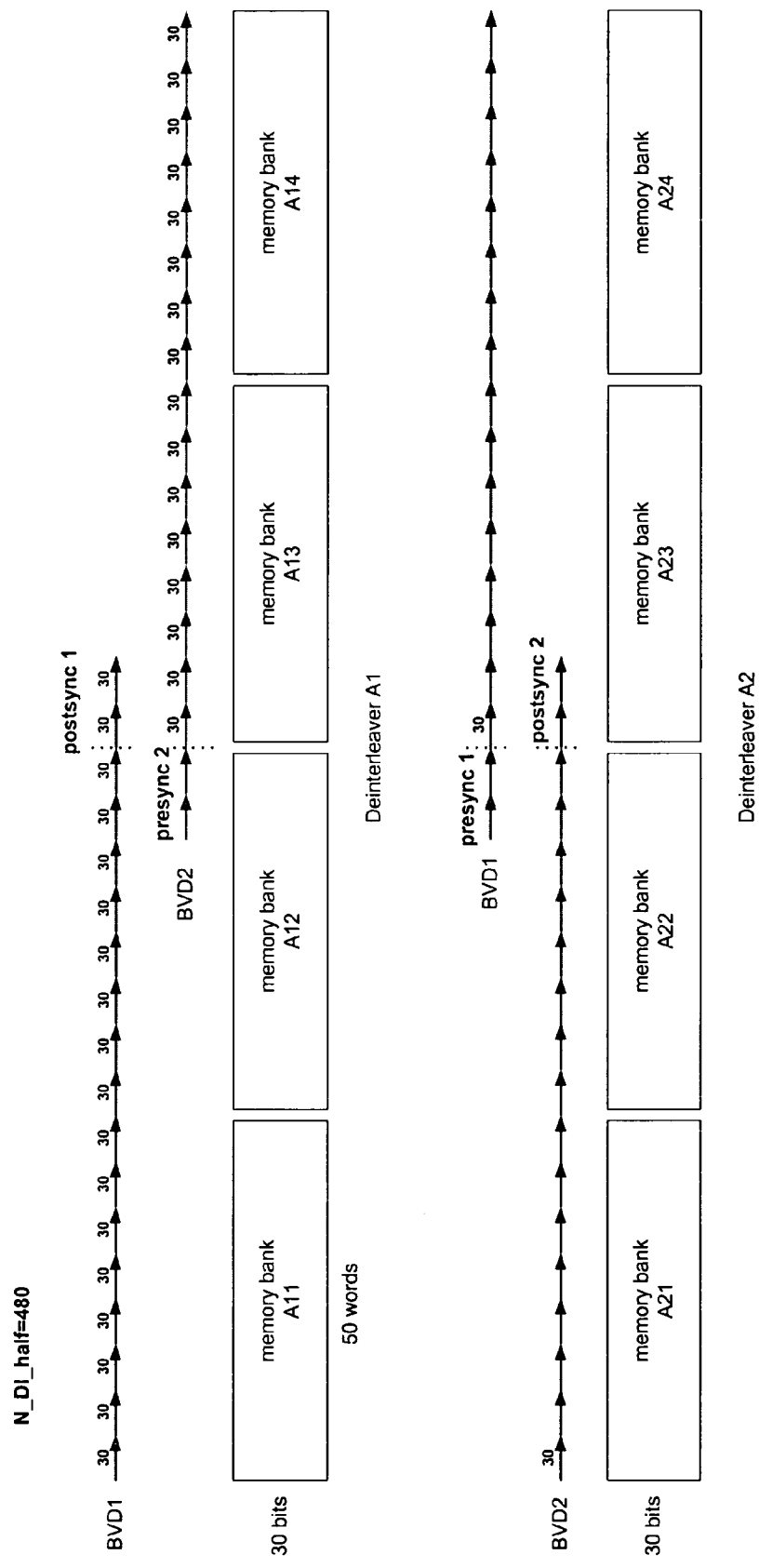

FIG. 4A corresponds to the deinterleaver data length of 600 bits and a half-deinterleaver length of 300 bits. FIGS. 4B, 4C, and 4D respectively correspond to deinterleaver data lengths of 750, 900, and 960 bits and half-deinterleaver lengths of 375, 450, and 480 bits. As seen in Table 1, these data lengths all fall within the rate group 3 that preferably uses two Viterbi decoders operating in parallel. Pre- and post-synchronization for the additional pair of Viterbi 243*c*, 243*d*, used for rate group 4, are similar to those shown in FIGS. 4A-4D.

In the exemplary embodiments shown, the decoding processing of the first and second Viterbi decoders 243*a*, 243*b* that are receiving their data from the half-deinterleavers 202, 204 of the first symbol deinterleaver 241*a* are performed with at least partial data overlap. The partial data overlap is used for pre and post synchronization of the two decoders working in parallel on the same stream of data. While not shown, the decoding processing of the third and fourth Viterbi decoders 243*c*, 243*d* that would receive their data from the second symbol deinterleaver 241*b* are also performed with partial data overlap.

The first and second Viterbi decoders 243*a*, 243*b* may use pre- and post-synchronization lengths of 2T information bits at the beginning and the end of their respective code word fragments. T is the traceback length of the Viterbi decoders as well as the length of the memory banks of the half-deinterleavers and the length of each of the code words. The 2T information bits are used to "ramp up" the path metric of the decoder at the beginning, and to synchronize into a surviving path for traceback at the end of the fragment. Both, presync and postsync lengths may be 2T=2*30=60 information bits to match with the deinterleaver length and code rates of Table 1.

Disregarding the overlapped data lengths, FIG. 4A exemplarily shows a half-deinterleaver with a data length of 300 bits, and ten words each 30 bits long are being input from the half-deinterleaver 202 to the first and second Viterbi decoders 243a, 243b. In FIG. 4C, the half-deinterleaver has a data length of 450 bits and sends fifteen words of 30 bits each to the Viterbi decoders. In FIG. 4D, the half-deinterleaver has a data length of 480 bits and sends sixteen words of 30 bits each to the Viterbi decoders. In FIG. 4B, the half-deinterleaver has a data length of 375 bits corresponding to twelve and a half words of 30 bits each. In this case, a first or a last 15 bits may be padded to form a 30 bit word.

In FIGS. 4A-4D, the input of the words to the Viterbi decoders is sequential but the sequential inputs to the pair of decoders are performed in parallel. For example, in FIG. 4A while the input of the first to tenth words from the half-deinterleaver 202 to the first and second Viterbi decoders 243a, 243b is sequential, the ten words going to the first Viterbi decoder 243a are being input concurrently with the ten words going to the second Viterbi decoder 243b. Therefore, the first Viterbi decoder receives its first word from the half-deinterleaver substantially at the same time that the second Viterbi decoder receives its first word from the same half-deinterleaver.

Without overlapping data, when some of the memory banks of the half-deinterleaver send their data to one Viterbi decoder and the others send their data to the other Viterbi decoder, there is no potential for memory collision due to decoder access to the memory banks. With overlapping data, on the other hand, memory collision problems due to simultaneous attempts to access the same memory bank by different decoders may occur, a potential problem addressed by aspects of the memory access scheme discussed herein.

FIG. 4A shows the interaction of the first and second Viterbi decoders with the first half-deinterleaver 202. While the first Viterbi decoder 243a reads data organized in groups of T=30 starting from memory bank A11 and progresses with ACS steps, the second Viterbi decoder 243b reads data for a presync operation 402 reads from memory bank A12 to ramp up its path metric. When the first Viterbi decoder 243a accesses memory bank A12 to obtain data for further decoding, the second Viterbi decoder 243b has already completed access of memory bank A12 and has continued to access memory bank A13, and therefore there will be no memory access collision. Thus, by the time the first Viterbi decoder 243a accesses the memory bank A12, the second Viterbi decoder 243b has moved to accessing memory banks A13 and A14 for performance of further ACS steps.

FIG. 4A also shows the interaction of the first and second Viterbi decoders with the second half-deinterleaver 204. The first and second Viterbi decoders decode their code words from the memory banks A21-A24 of the second half-deinterleaver 204 as explained with memory banks A11-A14. However, with the second half-deinterleaver 204, the first Viterbi decoder 243a starts a presync 406 with data from the memory bank A22, while the second Viterbi decoder 243b keeps on progressing with ACS steps with data from the memory bank A21. Again, memory access collision between the two Viterbi decoders is avoided.

For data rates in the rate group 4, the partitioning and access between the third and fourth Viterbi decoders 243a, 243b and the second deinterleaver 241b are organized in a manner similar to that described above regarding FIG. 4A.

In some embodiments, and considering FIG. 2A and FIG. 4A together, the first Viterbi decoder 243a receives data from memory banks A11, A12, and A13 of the first half-deinterleaver 202 while the second Viterbi decoder 243b is receiving data from memory banks A21, A22, and A23 of the second half-deinterleaver 204 of the first symbol deinterleaver 241a. The second Viterbi decoder 243b receives data from the memory banks A12, A13, and A14 of the first half-deinterleaver 202 while the first Viterbi decoder 243a is receiving data from the memory banks A22, A23, and A24 of the second half-deinterleaver 204. As such, the first Viterbi decoder 243a accesses memory banks A11, A12, A13, A22, A23, and A24 but may not access memory banks A14 or A21. Similarly, the second Viterbi decoder 243b accesses memory banks A12, A13, A14, A21, A22, and A23 but may not access memory banks A11 or A24. FIG. 2B similarly shows the interaction of the third and fourth Viterbi decoders with the half-deinterleavers of the second symbol interleaver. A counterpart of FIG. 2B would be similar to FIG. 4A with the decoders and memory banks appropriately modified.

Further, the ping-pong nature of half-deinterleaver input to the Viterbi decoders shown in FIG. 2A and the combined serial and parallel data input shown in FIG. 4A interact together. All memory banks A11-A14 of the first half-deinterleaver 202 operate in a substantially parallel fashion. While A11 and A12 are sending their data to the first Viterbi decoder 243a, A13 and A14 are sending their data to the second Viterbi decoder 243b. In this period, A21-A24 are being filled by data from their preceding demappers. Next, A21 and A22 start feeding the second Viterbi decoder 243b while A23 and A24 feed the first Viterbi decoder 243a. In this period, A11-A14 are being filled by data from their demapper. Superimposition of pre- and post-synchronization operations on the above data transfers causes A12 and A13 to send some of their data also to second and first decoders, respectively. Similarly, A22 and A23 send some data, that is used for the pre- and post-synchronization operations to the first and second decoders, respectively.

FIG. 4B and Table 1 show that at a data rate of 400 Mbps and code rate of 5/8, there is a special case for 375 information bits per half deinterleaver. In FIG. 4B, the half-deinterleavers 202, 204 have a data length of 375 bits corresponding to twelve and a half words of 30 bits each. This data length is treated differently. In some embodiments, an additional 15 zero pad bits 410 (information bits) are used for the very first word of the first Viterbi decoder 243a that is receiving data from the first half-deinterleaver 202 to align the last word with traceback length T=30 of the Viterbi decoder. Then the post-synchronization length 414 can line up with the first few traceback lengths of the second decoder 243b. of Correspondingly, for rate group 4 and code rate 5/8 resulting in a data rate of 800 Mbps, the present invention uses 15 zero pad bits (information bits) for the very first block of both first and third Viterbi decoders 243a, 243c, in the first half-deinterleavers of the first and second symbol deinterleavers 241a, 2431b, to align with traceback memory bank length T=30.

A similar padding is not used for the very first block of the second Viterbi decoder 243b when reading from the second half-deinterleaver 204. This is because when 375 bits of data are sent from A13 and A14 to 243b, the last 15 bits 415 do not amount to a full traceback length of 30 bits and 243b is not able to use them. This last 15 bits 415 of A14 may be used by 243b instead of padding for the first 15 bits of data from A21.

Certain exemplary embodiments based on the concepts described above are set forth below. In these embodiments, the deinterleaver length and the interleaver length are equal.

When data communication is performed at a rate in rate groups 1 or 2 of Table 1, then an exemplary embodiment of the present invention may use only one Viterbi decoder with a deinterleaver length of 100 or 150 information bits. For rate groups 1 and 2, the number of ACS steps undertaken by the Viterbi decoder is equal to the deinterleaver data length. The decoding operation may start at state zero and stop at state zero. Because there is only one Viterbi decoder, there will be no presync or postsync between decoders. At the deinterleaver boundaries, there will be a simple carry-over of path metric.

When data communication is performed at a rate in rate group 3 of Table 1, then two Viterbi decoders are used. The decoders stars and stops at state zero. The deinterleaver length is 1200 coded bits, that depending on the code rate corresponds to 600, 750, 900, or 960 information bits. The total number of ACS operations required for decoding 600 information bits is also 600 operations. For rate group 3 that uses parallel decoding, the number of ACS steps undertaken by each Viterbi decoder is equal to the half-deinterleaver information length, for example 300 operations for 600 information bits. The Viterbi decoder starts and stops at state zero. A presync and a postsync operation of length 2T=60 information bits are required. There is a simple carry-over of path metric at deinterleaver boundaries. There is a choice of traceback lengths of 2T=60, with memory banks of length T=30. The number of information bits may be N=300, 375, 450, or 480 information bits per half-deinterleaver. If the memory bank length of 30 bits and traceback length of 2T=60 bits are selected, for N=375 that is not an integer multiple of 30, the data sent to the Viterbi decoder is padded with 15 zero pad bits for the very first block of data sent to the first Viterbi decoder from the first half-deinterleaver. Padding the first block with zeros, causes the data to align with the memory bank length of 30 bits.

For data rates in the rate group 4, the operation is as with rate group 3. However, in rate group 4 the second symbol deinterleaver 241b that is used with the pair of third and fourth Viterbi decoders 243c, 243d enters into operation in parallel with and in addition to the elements used for the lower data rates.

Figure 5:
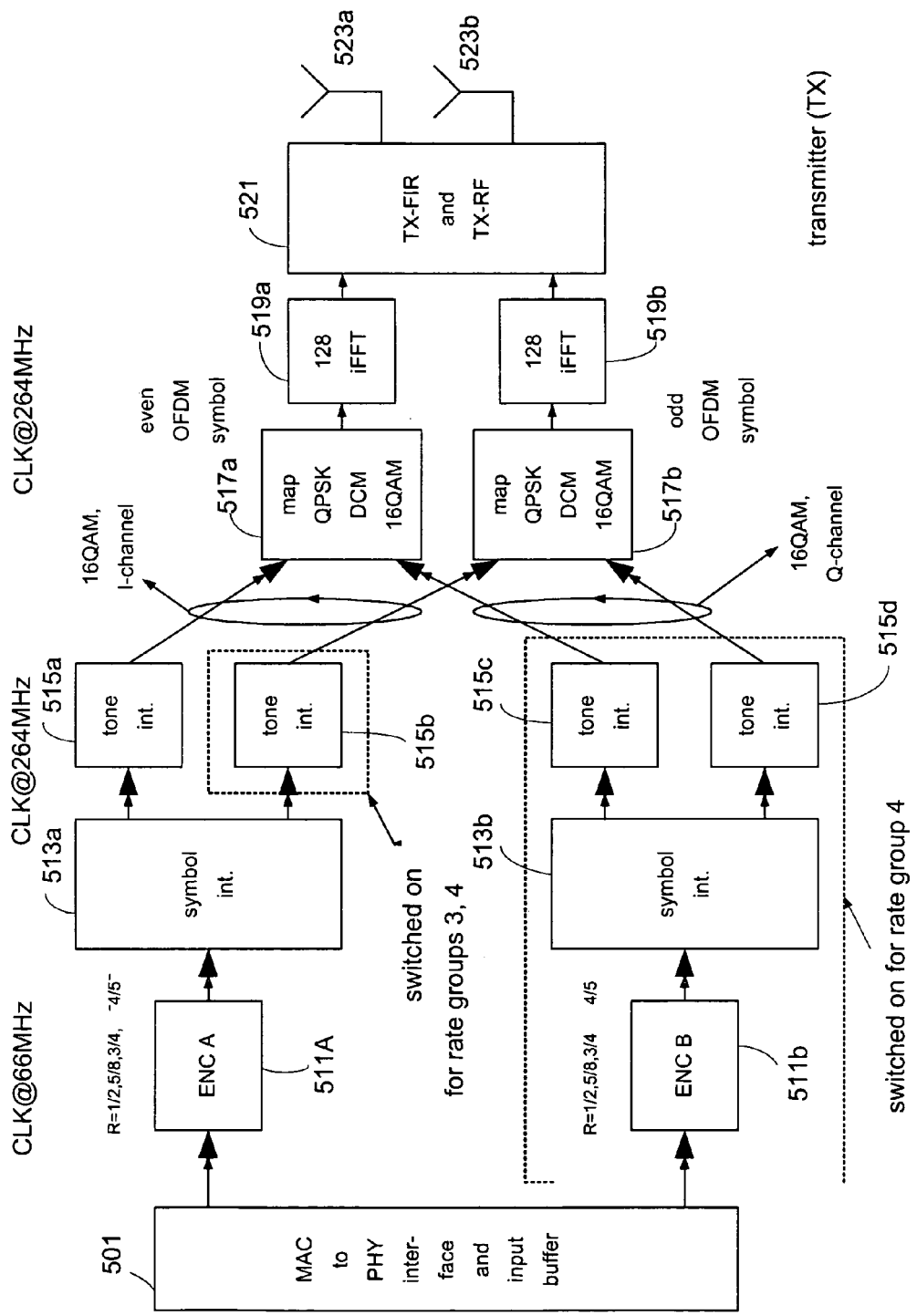
FIG. 5 is a block diagram of a transmission system in accordance with aspects of the invention.
Figure 6:
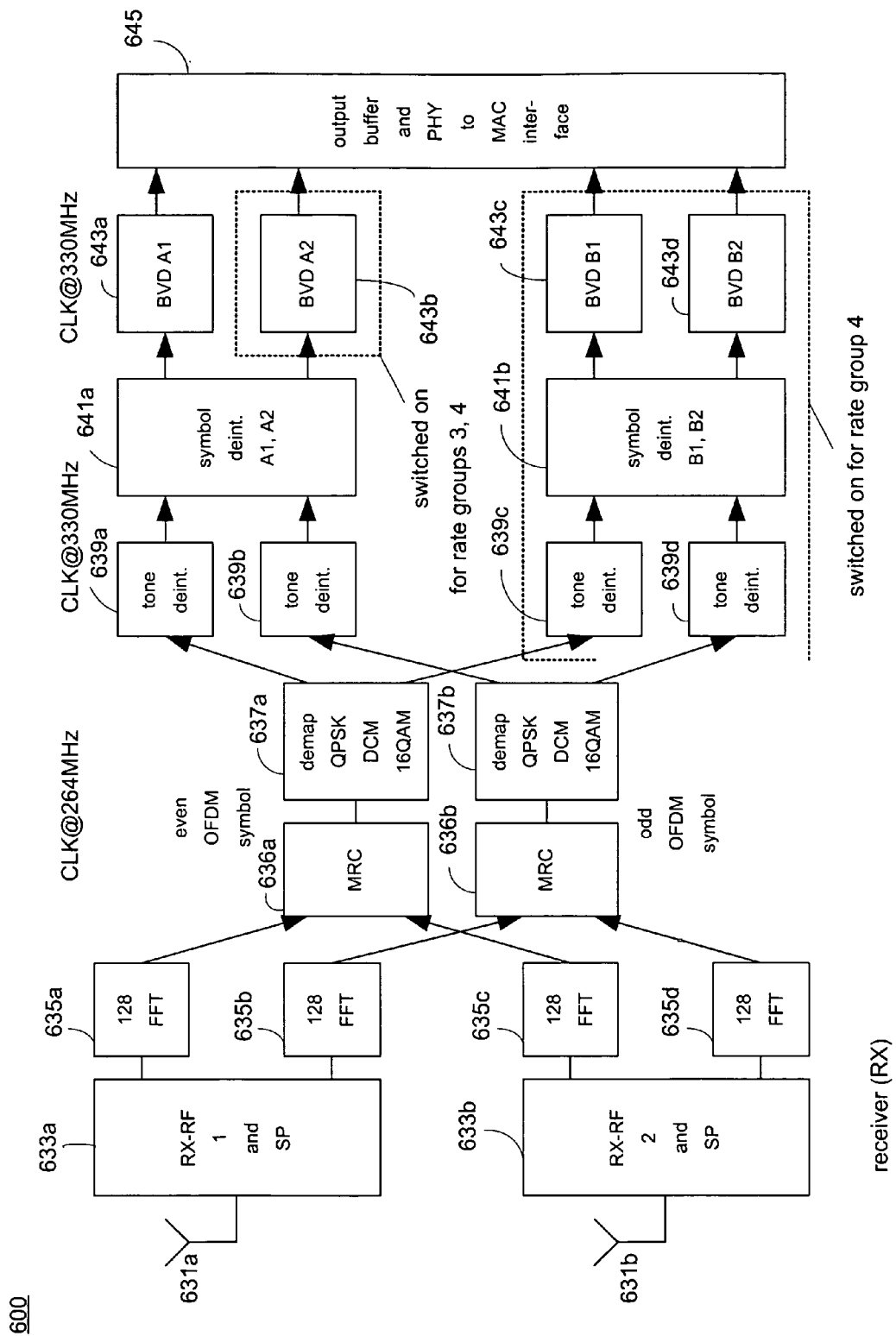
FIG. 6 is a block diagram of a reception system in accordance with aspects of the invention.

FIG. 5 is a block diagram of an OFDM transmitter 500 in accordance with aspects of the invention. FIG. 6 is a block diagram of a multiband OFDM receiver 600 in accordance with aspects of the invention. The transmitter of FIG. 5 and the receiver of FIG. 6 may be used in the communication system of FIG. 1.

Data to be transmitted may be provided to the transmitter 500 of FIG. 5 at different rates that are shown in Table 1. Some of the components of FIGS. 5 and 6 are utilized at all data rates. Other components are switched on only for higher data rates. The various data rates shown in Table 1 and their interaction with the components of the transmitter 500 of FIG. 5 are discussed in detail after the general structure of FIGS. 5 and 6 is presented.

As shown in FIG. 5, the transmitter 500 may be used for UWB transmission of OFDM symbols. At the transmitter 500, a MAC 501 sends a bit stream of data to a first channel encoder 511a. The encoder 511a encodes the stream of bits from the MAC 501 for error correction. In most embodiments the encoder encodes the bit stream using a convolutional code. The convolutional code may have a memory of 6 bits. Preferably the encoder 511a encodes data at different code rates depending on selection of an information rate, generally indicated to the encoder by the MAC 501. Some exemplary encoding rates of R=1/2, 5/8, 3/4, and 4/5 are shown in FIG. 5 and will be discussed in the description of Table 1. In various embodiments, different encoding schemes may be used. Generally, however, the encoder receives a bit stream and provides blocks of encoded symbols. The first encoder 511a may be operating at 66 MHz.

A second encoder 511b may be switched on for higher rates of data. A chain of data processing corresponding to lower data rates and utilizing only the first encoder 511a is described below.

A symbol interleaver 513a receives the encoded symbols and interleaves the symbols. Interleaving of symbols reduces effects of burst errors that may occur during transmission over a channel of a communication medium. Some of the interleaved symbols are provided to a first processing chain 514, and some of the interleaved symbols are provided to a second processing chain 516. The processing chains 514, 516 operate in parallel. Each processing chain receives every other symbol, for example the first processing chain 514 may receive even symbols of a sequence of symbols and the second processing chain 516 may receive odd symbols of the sequence of symbols. The use of two processing chains allows for reduction of effective clock rate used to drive the processing chains. For example, the use of two processing chains, allows for reduction of the clock rate by one-half of an expected clock rate for a single processing chain. When the baseband signal is organized in even and odd OFDM symbols and 2 OFDM symbols are processed at the same time, the clock rate is reduced from 528 MHz to 264 MHz.

As illustrated, the processing chains 514, 516 each include a tone interleaver 515a, 515b, a mapper 517a, 517b, and an inverse iFFT block 519a, 519b. The tone interleavers interleave bits of the symbols in order to reduce possible effects of burst errors over a particular subcarrier of a channel of a communication medium.

At lower data rates corresponding to rate groups 1 and 2, that are shown in Table 1, one tone interleaver 515a, one mapper 517a, and one iFFT 519a may be sufficient while the data from the one interleaver 515a may still be divided into two streams of odd and even symbols and fed to two mappers. FIG. 5 and the following description, however, are directed to a situation where lower data rates use one tone interleaver and a second and parallel tone interleaver is switched on for higher rates only.

After the encoded bit stream is interleaved by the symbol interleaver 513a and the tone interleavers 515a, 515b it is mapped onto a constellation using the first and second mappers 517a, 517b. The mappers perform a mapping of groups of bits, for example using a QPSK or DCM scheme. So, the constellation may be a QPSK or a DCM constellation. A DCM constellation corresponds to two shifted QPSK constellations over two subcarriers of a channel used for transmission of OFDM symbols. The DCM operates effectively as a 16QAM constellation with a rate 1/2 repetition code over two subcarriers. Further repetition coding, referred to as conjugate symmetric spreading, and/or frequency spreading, may be applied. The mappers performs QPSK modulation for lower selected information rates and DCM and 16QAM for higher selected information rates.

Each of the two parallel processing chains including the tone-interleaver, QPSK/DCM mapping, and iFFT, may be operating at a clock rate of 264 MHz. After mapping and spreading at the mappers 517a, 517b the signal may be grouped into 128 subcarriers, each comprising one OFDM symbol, and transformed from frequency to time domain using the iFFT blocks 519a, 519b.

After the iFFT block 519a, the processing is parallelized by a factor of 4 for FIR-filtering, using a clock rate of 264 MHz instead of 1056 MHz. The FIR filter that is included in the transmitter block 521 is implemented as a 4× polyphase filter. Parallelization is not at the OFDM symbol level but on the time sample level such that four complex time samples are processed at the same time.

The time domain data from the iFFT block 519a enters a transmitter block 521. The transmitter block includes a finite impulse response filter (FIR) and an RF transmitter and radiates information using one or more antennas 523a, 523b. The transmitter block 521 also includes upconversion mixers, amplifiers, and the like that are associated with RF transmitters. An example of upconversion mixers and amplifiers associated with RF transmitters may be found in U.S. patent application Ser. No. 11/267,829, filed Nov. 3, 6005, the disclosure of which is incorporated by reference herein.

The FIR filter may be capable of operating on four complex time samples simultaneously. After being filtered at the FIR filter, the baseband signal is converted to analog domain using a digital-to-analog converter (DAC) that is not shown.

At the transmitter block 521, the signal is upconverted to passband, amplified, and radiated over a transmit antenna 523a. Frequency hopping according to a time frequency code number provided by the MAC 501 is performed.

In summary, the encoder receives a bit stream from the MAC and encodes the bit stream using an error correction code, for example a convolutional code of memory 6. The encoder is clocked, for example, at 66 MHz. Depending on a rate selection indication provided by the MAC, the encoder encodes the bit stream using a selected code rate, for example at a 1/3 code rate, a 1/2 code rate, a 5/8 code rate, a 3/4 code rate, or a 4/5 code rate. The encoded bit stream is interleaved by a symbol interleaver and then split into two separate bit streams, each bit stream receiving bits for every other OFDM symbol. Splitting the bit stream allow further processing, such as tone interleaving, mapping, and inverse fast Fourier transform, to be performed at a reduced clock rate, for example at 264 MHz instead of 528 MHz. Each of the separate bit streams are separately tone interleaved and mapped. The mapping scheme used as either a QPSK, DCM, or 16QAM scheme, with the use of each scheme based on a rate selection signal provided by the MAC. After mapping each signal is separately grouped into, for example, 128 subcarriers forming an OFDM symbol and transformed from the frequency domain to the time domain using, for example, a 128-point iFFT. After iFFT the signal is parallelized by a factor of four on the time-sample level for FIR-filtering, using a clock rate of 264 MHz instead of 1056 MHz, for example, with FIR-filtering preferably being accomplished by a 4× polyphase filter.

As the marking on FIG. 5 indicate, a second path starting with the second encoder 511b is switched on for data in rate group 4. The components along the second path, a second symbol interleaver 513b and third and fourth tone interleavers 515c, 515d operate similarly to the components in the first path starting from the first encoder 511a.

FIG. 6 is block diagram of a receiver 600 in accordance with aspects of the invention. One or more receiver blocks 233a, 233b, that include an RF receiver and a signal processor, receive a signals via antennas 631a, 631b. The RF receiver amplifies the signal received by the antenna and downconverts the signal to baseband.

As explained above, the signal received at the receiver antenna 631a, 631b is amplified, and downconverted from passband to baseband. A received signal strength indication (RSSI) signal is provided to the baseband to perform automatic gain control (AGC). Frequency hopping according to a time-frequency code number provided by an associated MAC 645 is performed. Again, the description of the receiver 600, first follows only the processing path of the low data rate signal using only the first encoder 511a at the transmitter 500.

One or more signal processors are included in a receiver block 233a and are used for packet detection, frame synchronization, automatic gain control and separating the time domain sample stream into even and odd OFDM symbols. Assuming the analog-to-digital conversion is clocked at 528 MHz, the signal processors are clocked at 264 MHz with 2× parallelization. After analog-to-digital conversion, the signal processors detect the beginning of the packet using cross-correlation, auto-correlation and signal energy computation based on known preamble sequences. During the preamble, AGC is performed using an analog-to-digital converted version of the RSSI signal from the analog RF. AGC includes the computation of gain settings for the low-noise amplifier (LNA), the mixer, and programmable gain amplifier (PGA), in a first coarse AGC (CAGC) including LNA, mixer, PGA, and a second fine AGC (FAGC) only using PGA. After the packet has been detected, an overlap-and-add unit removes the null prefix of the OFDM symbols in the time domain, and aligns/separates the time domain signal into even and odd OFDM symbols. From there on, 2× parallelization is implemented on the OFDM symbol level, having parallel processing chains for the even and odd OFDM symbols.

The signal processor part of the receiver block 233a takes the time-aligned sample stream (time domain), and recovers the information (data) bits, to be delivered to the receiver MAC 645. Data processing by the signal processor is clocked at CLK264 MHz; 2× parallelization is implemented on the OFDM symbol level, having parallel processing chains for even and odd OFDM symbols. So, the signal processor provides one of the two time domain symbol streams to a first processing chain 614 and the other of the two time domain symbol streams to a second processing chain 616. Use of the two processing chains 614, 616, operating in parallel, allows for processing at a reduced clock rate, as compared to a clock rate required by use of only a single processing chain. In some embodiments, separation of symbols into the parallel symbol streams occurs after an overlap-and-add unit of the signal processor removes the null prefix (which may be implemented as a null postfix).

For each processing chain operating on the even symbols or the odd symbols, six steps may be undertaken. First, one of the two parallel 128-point FFT blocks 635a or 635b transforms the signal from time domain to frequency domain. Second, channel estimation uses the last 6 OFDM symbols of the preamble (channel estimation symbols) to estimate the channel coefficients of each subcarrier. Third, phase estimation uses the embedded pilot tones (12 subcarriers) to estimate the phase offset. Fourth, channel and phase estimate are used to compensate the effects of multipath fading channels and phase/frequency offset. Fifth, frequency and/or conjugate symmetric despreading is applied prior to QPSK/DCM demapping. Sixth, QPSK/DCM demapping 637a, 637b recovers soft reliability bit estimates for the encoded bits.

The demapper recovers soft reliability bit estimates for the encoded bits of the stream, and the tone deinterleaver tone deinterleaves the bit stream. The demapper demaps information using a scheme indicated by the associated receiver MAC 645.

After the FFT blocks, the processing chains may include circuitry for performing channel estimation and circuitry for performing phase estimation, with the results used to compensate for multipath fading channels and phase/frequency offset. In addition, each processing chain may also include circuitry for performing frequency and/or conjugate symmetric despreading prior to demapping by the demapper. These types of circuitry are called parallel maximum ratio combining (MRC) blocks.

Outputs of the FFT blocks are received by two MRC blocks 636a, 636b that are located before the demappers 637a, 637b. The two MRC blocks 636a, 636b perform a procedure commonly referred to maximum ratio combining. The two transmitter antennas 223a, 223b may radiate in two spatial polarizations. During maximum ratio combining, after channel estimation/correction, phase estimation/correction, and transform into the frequency domain, the signals from both receiver antennas 631a, 631b are coherently added together in the MRCs 636a, 636b. This procedure improves the robustness of the received signal, as it becomes more unlikely that both received signals undergo the same fades on the same subcarrier frequencies. Thus, the received signals mutually support each other. For convenience indicating the outputs of the FFT blocks as either even or odd symbols, outputs of FFT blocks providing even symbols are received by a first MRC block 636a and outputs of FFT blocks providing odd symbols are received by a second MRC block 636b. Accordingly, each MRC block receives representations of the same signal as received by the different antennas. Each MRC block performs a diversity combining function, preferably summing the signals, and doing so weighting each of the signals to be summed by their respective signal-to-noise ratios. Each MRC block therefore, receives some of its input from one of the antennas and the rest from the other antenna. For example, the MRC 636a receives input from antenna 631a through the receiver block 233a and the FFT block 635a and input from antenna 631b through the receiver block 233b and the FFT block 635c.

After demapping 637a, 637b the soft bit estimates are deinterleaved by a tone deinterleaver 639a for even symbols and 637b for odd symbols. The encoded bits of the even 614 and odd 215 OFDM symbol stream are merged in a symbol deinterleaver 641a. After symbol deinterleaving, the coded bits are depunctured and fed to a first Viterbi decoder 643a. It should be noted that depuncturing, as well as merging of the data streams and separating data blocks for the Viterbi decoders, may not necessarily be considered as being performed by the symbol deinterleaver, but is illustrated as such in FIG. 6 for purposes of convenience.

When higher rates of data are transmitted by the transmitter 500, then the receiver 600 may use more than just the first Viterbi decoder 643a to decode the data. For example, at high data rates, the decoding may be implemented using two parallel block Viterbi decoders 643a, 643b that work on different parts of the output from the deinterleaver 641a.

The data provided to the two parallel Viterbi decoders 643a, 643b has partially overlapping windows, particularly for embodiments where the data has been encoded using a single encoder. The partially overlapping windows, with data blocks for each decoder 643a, 643b including bits in common with data blocks provided to the other decoder 643b, 643a, are used, for example, to pre-synchronize and post-synchronize the Viterbi decoders.

In summary, during receiver operation a signal received by the antenna is amplified and downconverted to baseband. Downconversion may be performed in a frequency hopping manner, in accordance with a time-frequency pattern indicated by an associated MAC. The baseband signal is processed by a signal processor, performing functions such as packet detection, frame synchronization, automatic gain control determination and other functions normally performed by a signal processor. The signal processor separates the time domain sample stream into two streams, with each stream containing every other OFDM symbol resulting in odd and even symbol stream. In such implementations the signal processor may largely, or entirely, incorporate parallel processing streams, with data received from analog-to-digital conversion circuitry split into two streams operated on separately, with every other OFDM processed by each parallel processing stream. In the alternative, however, parallelization may be accomplished after packet detection and after removal of a null prefix (which may be a postfix) in the time domain. The parallel streams are each provided to a separate processing chain, including, for example, a FFT block, a demapper, and a tone deinterleaver. Each processing chain separately transforms their respective signals from the time domain to the frequency domain, demaps the OFDM symbols to obtain soft bit estimates, and deinterleaves using the tone deinterleaver. Assuming that an ADC of the receiver is clocked at 528 MHz, then each processing chain is clocked at 264 MHz. The bits provided by the separate processing chains, each providing every other OFDM symbol, are merged and deinterleaved by a symbol deinterleaver. The deinterleaved bits are decoded by parallel Viterbi decoders.

As the marking on FIG. 6 indicate, the second Viterbi decoder 643b is switched on for data in rate groups 3 and 4 and a second path starting with third and fourth tone deinterleavers 639c, 639d is switched on for data in rate group 4. The second path includes a second symbol deinterleaver 641b and a second pair of third and fourth Viterbi decoders 643c, 643d. The second path operates similarly to the path beginning at the first and second tone deinterleavers 639a, 639b.

For group 4, that includes high data rate modes from 640 Mbps to 1024 Mbps, at the transmitter 500, a second encoding chain is switched on, and driven by a corresponding higher data rate from the input buffer of the MAC 501. The second encoding chain includes the second encoder 511b, the second symbol interleaver 513b, and the second pair of tone interleavers 515c, 515d. The second mapper 517b uses 16QAM modulation with two bits per each 16QAM symbol coming from a data stream originating at the first encoder 511a, and two bits per 16QAM symbol coming from the data stream originating at the second encoder 511b. The 2 bits originating at the first encoder 511a are on the I-channel of the 16QAM symbol which is the real-part of complex constellation 16QAM symbol. The 2 bits originating at the second encoder 511b are on the Q-channel of the 16QAM symbol which is the imaginary part of the complex constellation 16QAM symbol.

Correspondingly, at the receiver 600, the demappers 637a, 637b apply 16QAM demapping. Each of the demappers 637a, 637b, separates the incoming data stream into two streams resulting in four streams of data. The four data streams are divided into two pairs. One pair drives the first and second tone deinterleavers 639a, 639b, the first symbol deinterleaver 641a, and the first and second Viterbi decoders 643a, 643b. The other pair drives the third and fourth tone deinterleavers 639c, 639d, the second symbol deinterleaver 641b, and the third and fourth Viterbi decoders 643c, 643d.

Table 1 shows the code rate corresponding to each data rate. The code rate R is defined as a ratio of input information bits k to output coded bits n, such that R=k/n. Puncturing can be used to obtain several different code rates higher than a mother code rate that is the rate of the code used. According to a predefined puncturing pattern, at the encoder, coded bits are omitted from the output bit stream. Correspondingly, at the decoder, depuncturing is performed. In depuncturing, dummy "don't care" inputs are inserted in place of the omitted bits. In soft-input decoding, the depuncturing is commonly implemented as simply inserting zero-amplitude values in place of the omitted bits.

The code rates shown in Table 1 may be implemented by addition of puncturing to a mother code rate.

For the rate group 3 with a data rate of 512 Mbps, a puncturing resulting in a code rate of 4/5 is applied. Every 5 input bits are encoded into 5 coded bits and the 5 coded bits are punctured to result in 4 coded bits that are transmitted by the transmitter. At the receiver, the 4 coded bits are depunctured to yield 5 input bits.

Table 1 shows the coded length and the data length for the deinterleaver that is used for each rate group and each data rate for each code rate. For example, for the data rate of 53.3 Mbps, included in the rate group 1, and a code rate of 1/3, each information bit or data bit entering the symbol interleaver 513*a* is interleaved into 3 coded bits and every 3 coded bits entering the deinterleaver 641*a* are deinterleaved back to 1 bit of data or information. Therefore, if the coded length of the deinterleaver 641*a* is 300 bits, then the data length of the deinterleaver 641*a* would be 300*(1/3)=100 bits. As another example, for the data rate of 400 Mbps in the rate group 3 and a code rate of 5/8, every 5 information bits are interleaved into 8 coded bits and every 8 coded bits entering the deinterleaver 641*a*, 641*b* produce 5 bits of data or information. Therefore, if the coded length of the deinterleaver 641*a*, 641*b* is 1200 bits, then the data length of the deinterleaver would be 1200*(5/8)=750 bits.

Table 1 also shows deinterleaver lengths for the symbol deinterleavers 641*a*, 641*b*, and the number of ACS steps processed by each Viterbi decoder 643*a*, 643*b*, 643*c*, 643*d* per deinterleaver for each of the rate groups 1 to 4.

As explained above with reference to FIG. 5 and FIG. 6, for rate groups 1 and 2 only one tone interleaver 515*a* at the transmitter 500 and one Viterbi decoder 643*a* at the receiver 600 are used. As a result, Table 1 shows the interaction of only the first Viterbi decoder 643*a* for the rate groups 1 and 2.

For rate group 3, the second tone interleaver 515*b* at the transmitter 500 and the second Viterbi decoder 641*b* at the receiver 600 are switched on in addition to those operating for the rate groups 1 and 2. As a result, Table 1 shows the interaction of both the first and second Viterbi decoders 643*a*, 643*b* for the rate group 3.

For rate group 4, the second encoder 511*b* together with its associated third and fourth tone interleavers 515*c*, 515*d* are switched on at the transmitter 500. At the receiver 600, the third and fourth Viterbi decoders 641*c*, 641*d* are switched on in addition to those operating for the rate groups 1, 2, and 3. As a result, Table 1 shows the interaction of all four Viterbi decoders 643*a*, 643*b*, 643*c*, 34*d* for the rate group 4.

The structure of FIG. 2A may be used to also show the data flow from the first symbol deinterleaver 641*a* to the first Viterbi decoder 643*a* for data in rate groups 1 and 2 and to both the first and second Viterbi decoders 643*a*, 643*b* for data in rate groups 3 and 4. As explained above, the maximum data rate that can be supported by each Viterbi decoder 643*a*, 643*b*, 643*c*, 643*d* is limited by the clock frequency of the ACS unit. For example, in a fully parallel implementation of the ACS unit, with a clock frequency of 330 MHz, the maximal throughput is limited to at most 330 Mbps (for radix 2 or base 2 bits of 0 and 1). Thus, rate groups 1 and 2 in Table 1, that remain below 330 Mbps can be supported by a single Viterbi decoder with an ACS clock frequency of 330 MHz.

As indicated by Table 1, for data in rate group 3, the second Viterbi decoder 643*b* comes on line in addition to the first Viterbi decoder 643*a*.

In an implementation using two Viterbi decoders, for example for data rates in the rate group 3, the two Viterbi decoders operate in parallel on different fragments of the received code word. In the system of the present invention, the symbol deinterleaver is used as an input buffer to the Viterbi decoders. For data rates from rate group 3 shown in Table 1, two Viterbi decoders are operating in parallel on the deinterleaver length of 1200 coded bits, each Viterbi decoder decoding information bits from one half of the deinterleaver size and filling a part of the joint Viterbi output buffer.

The structure of FIG. 2B may be used to also show the flow of data from the second symbol deinterleaver 641*b* to the third and fourth Viterbi decoders 643*c*, 643*d*. As indicated by Table 1, for data in rate group 4, the third and fourth Viterbi decoders 643*c*, 643*d* also come into use in addition to the first and second Viterbi decoders 643*a*, 643*b*. Therefore, for rate group 4, both pairs of Viterbi decoders 643*a*, 643*b* and 643*c*, 643*d* are decoding in parallel, working on two independent streams of data from the first symbol deinterleaver 641*a* and the second symbol deinterleaver 641*b*. As seen above, when the Viterbi decoders of FIG. 2B are operating, all of the four Viterbi decoders 643*a*, 643*b*, 643*c*, 643*d* in FIGS. 2A and 2B are operating.

Table 1 lists the number of ACS steps per deinterleaver for each Viterbi decoder. For rate groups 1 and 2, where only one Viterbi decoder 643*a* is being used, the number of ACS steps performed by the Viterbi decoder per deinterleaver is equal to the deinterleaver data rate in bits. For example, for a data rate of 53.3 Mbps and a deinterleaver information length of 100 bits, the number of ACS steps for the first Viterbi decoder 643*a* is also 100 steps per deinterleaver. For rate groups 3 and 4 where more than one Viterbi decoder is being used, the number of ACS steps performed for each traceback length and before the decoder produces a decoded data stream is equal to half the data length of the deinterleaver in bits.

Table 1 indicates that for rate group 4, the deinterleaver coded length and data length for each deinterleaver is twice the coded length and data length of the deinterleavers of rate group 3. However, as shown in FIG. 5 and FIG. 6, for communication at data rate 4, an extra pair of deinterleavers are used. Therefore, for rate group 4, the deinterleaver length is shown as 2×1200 or 2×600 indicating two deinterleavers each of length 1200 bits or 600 bits. The number of ACS steps per deinterleaver, hence, is half the data length of each of the two deinterleavers and remains equal to the number of ACS steps per deinterleaver for rate group 3.

Although the invention has been described with respect to certain specific embodiments, it should be recognized that the invention comprises the claims and their equivalents supported by this disclosure and insubstantial variations thereof.

TABLE 1

| Rate group | Data rate (Mbps) | modulation | code rate | deinterleaver coded length (bits) | deinterleaver information, data length (bits) | Viterbi decoder 643a Number of ACS steps per deinterleaver | Viterbi decoder 643b Number of ACS steps per deinterleaver | Viterbi decoder 643c Number of ACS steps per deinterleaver | Viterbi decoder 643d Number of ACS steps per deinterleaver |
|---|---|---|---|---|---|---|---|---|---|
| 1 | 53.3 | QPSK | 1/3 | 300 | 100 | 100 | — | — | — |
| 1 | 80 | QPSK | 1/2 | 300 | 150 | 150 | — | — | — |
| 2 | 106.7 | QPSK | 1/3 | 600 | 200 | 200 | — | — | — |
| 2 | 160 | QPSK | 1/2 | 600 | 300 | 300 | — | — | — |
| 2 | 200 | QPSK | 5/8 | 600 | 375 | 375 | — | — | — |
| 3 | 320 | DCM | 1/2 | 1200 | 600 | 300 | 300 | — | — |
| 3 | 400 | DCM | 5/8 | 1200 | 750 | 375 | 375 | — | — |
| 3 | 480 | DCM | 3/4 | 1200 | 900 | 450 | 450 | — | — |
| 3 | 512 | DCM | 4/5 | 1200 | 960 | 480 | 480 | — | — |
| 4 | 640 | 16QAM | 1/2 | 2 × 1200 | 2 × 600 | 300 | 300 | 300 | 300 |
| 4 | 800 | 16QAM | 5/8 | 2 × 1200 | 2 × 750 | 375 | 375 | 375 | 375 |
| 4 | 960 | 16QAM | 3/4 | 2 × 1200 | 2 × 900 | 450 | 450 | 450 | 450 |
| 4 | 1024 | 16QAM | 4/5 | 2 × 1200 | 2 × 960 | 480 | 480 | 480 | 480 |

What is claimed is:

1. A deinterleaver and decoder system comprising:
a deinterleaver for deinterleaving data, the deinterleaver including a plurality of memory banks for storing deinterleaved data; and
a plurality of Viterbi decoders for decoding the deinterleaved data, the Viterbi decoders each configured to access separate ones of the plurality of memory banks than others of the Viterbi decoders, such that the plurality of Viterbi decoders can read data from memory banks in parallel, wherein a number of decoding steps undertaken by each of the Viterbi decoders for decoding the deinterleaved data is equal to a deinterleaver data length in bits, and wherein each Viterbi decoder receives some data that common to a plurality of the memory banks, the common data allowing the Viterbi decoders to pre-synchronize and post-synchronize.

2. A data decoding system comprising:
a first deinterleaver for deinterleaving demodulated data;
a first pair of Viterbi decoders configured to operate in parallel for decoding deinterleaved data, wherein the first pair of Viterbi decoders includes a first Viterbi decoder and a second Viterbi decoder;
a second deinterleaver for deinterleaving the demodulated data; and
a second pair of Viterbi decoders operating in parallel for decoding deinterleaved data, wherein the first deinterleaver is configured to provide the deinterleaved data to the first pair of Viterbi decoders and the second deinterleaver is configured to provide the deinterleaved data to the second pair of Viterbi decoders.

3. A data decoding system comprising:
a first deinterleaver for deinterleaving demodulated data;
a first pair of Viterbi decoders configured to operate in parallel for decoding deinterleaved data, wherein the first pair of Viterbi decoders includes a first Viterbi decoder and a second Viterbi decoder, wherein the first deinterleaver includes: a first half-deinterleaver; and a second half-deinterleaver, wherein the first half-deinterleaver and the second half-deinterleaver each include first, second, third, and fourth memory banks.

4. The data decoding system of claim 3, wherein each of the first, the second, the third, and the fourth memory banks stores fifty words, each word including thirty bits of data.

5. A data decoding system comprising:
a first deinterleaver for deinterleaving demodulated data;
a first pair of Viterbi decoders configured to operate in parallel for decoding deinterleaved data, wherein the first pair of Viterbi decoders includes a first Viterbi decoder and a second Viterbi decoder, wherein the first half-deinterleaver and the second half-deinterleaver transfer data from a demapper to the first pair of Viterbi decoders in a ping pong fashion including:
the second half-deinterleaver receiving data from the demapper while the first half-deinterleaver is sending data to the first pair of Viterbi decoders; and
the first half-deinterleaver receiving data from the demapper while the second half-deinterleaver is sending data to the first pair of Viterbi decoders.

6. A data decoding system comprising:
a first deinterleaver for deinterleaving demodulated data;
a first pair of Viterbi decoders configured to operate in parallel for decoding deinterleaved data, wherein the first pair of Viterbi decoders includes a first Viterbi decoder and a second Viterbi decoder, wherein the data arriving at the first encoder and being coded at a code rate selected from 1/3, 1/2, 1/3, 1/2, and 5/8, respectively yield deinterleaver data lengths of 600 bits, 750 bits, 900 bits, and 960 bits, corresponding to a deinterleaver coded length of 1200 bits.

7. A method for increasing a speed of decoding by implementing decoders in parallel, wherein each decoder operates on a different fragment of a codeword received from a buffer, the method comprising:
dividing the buffer into memory banks, each memory bank for storing a plurality of codewords, the memory banks divided into groups of memory banks, the codewords filling the memory banks in a serial order, the serial order filling one memory bank after another within a same group of memory banks;
storing the codewords in a first group of memory banks;
decoding first fragments of the codewords using a first decoder and decoding second fragments of the codewords using a second decoder in parallel during a first period;
storing further codewords in a second group of memory banks during the first period; and
decoding first fragments of the further codewords using the first decoder and decoding second fragments of the further codewords using the second decoder in parallel during a second period.

8. A method for access by a pair of decoders to a buffer memory being divided into a first buffer part and a second buffer part, the method comprising:
- receiving data at the pair of decoders from the first buffer part during a first period;
- decoding the data at the pair of decoders during the first period;
- receiving further data at the pair of decoders from the second buffer part during a second period; and
- decoding the further data at the pair of decoders during the second period, wherein the first buffer part is receiving the data at a rate higher than a decoding rate of each decoder in the pair of decoders, and wherein the second buffer part is receiving the further data at a rate higher than a decoding rate of each decoder in the pair of decoders.

9. A method for parallel decoding of codewords by data overlapped processing between a pair of decoders operating in parallel, the method comprising:
- pre-synchronizing a second decoder by providing an end portion of a first group of codewords being decoded by the first decoder to the second decoder; and
- post-synchronizing the first decoder by providing a beginning portion of a second group of codewords being decoded by the second decoder to the first decoder, wherein the end portion of the first group is received by the second decoder concurrently with a beginning portion of the first group being received by the first decoder, wherein the beginning portion of the second group is received by the first encoder concurrently with an end portion of the second group being received by the second decoder, wherein the beginning portion of the first group and the end portion of the first group are stored in different memory banks, and wherein the beginning portion of the second group and the end portion of the second group are stored in different memory banks.

10. The method of claim 9 wherein the first decoder and the second decoder are Viterbi decoders, wherein the pre-synchronizing ramps up path metrics of the second decoder, and wherein the post-synchronizing completes traceback operation of the first decoder.

11. The method for providing data to decoders operating in parallel on serially provided data, the method comprising:
- dividing the data between a plurality of memory banks;
- providing a first group of the data to a first one of the decoders;
- providing a second group of the data to a second one of the decoders; and
- providing a third group of the data to both the first one and the second one of the decoders, wherein the first group is provided to the first one of the decoders concurrently with the third group provided to the second one of the decoders, wherein the second group is provided to the second one of the decoders concurrently with the third group provided to the first one of the decoders, wherein the first group and the second group are stored in mutually exclusive memory banks, and wherein the third group is divided between memory banks storing the first group and memory banks storing the second group.

* * * * *